United States Patent
Zhu

(10) Patent No.: US 9,202,913 B2
(45) Date of Patent: Dec. 1, 2015

(54) METHOD FOR MANUFACTURING SEMICONDUCTOR STRUCTURE

(75) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 13/133,120

(22) PCT Filed: Feb. 25, 2011

(86) PCT No.: PCT/CN2011/071309
§ 371 (c)(1),
(2), (4) Date: Jun. 6, 2011

(87) PCT Pub. No.: WO2012/041037
PCT Pub. Date: Apr. 5, 2012

(65) Prior Publication Data
US 2012/0083106 A1      Apr. 5, 2012

(30) Foreign Application Priority Data
Sep. 30, 2010   (CN) .......................... 2010 1 0501712

(51) Int. Cl.
*H01L 21/8238* (2006.01)
*H01L 29/78* (2006.01)
*H01L 29/66* (2006.01)

(52) U.S. Cl.
CPC ........ *H01L 29/7847* (2013.01); *H01L 29/6659* (2013.01); *H01L 29/7833* (2013.01); *H01L 29/665* (2013.01); *H01L 29/66537* (2013.01); *H01L 29/66545* (2013.01)

(58) Field of Classification Search
CPC ................ H01L 21/477; H01L 29/165; H01L 20/66537; H01L 29/7847

USPC .................. 438/227; 257/E21.453, E21.635, 257/E21.623, E21.458
See application file for complete search history.

(56) References Cited

U.S. PATENT DOCUMENTS

| 6,337,262 B1 * | 1/2002 | Pradeep et al. ............... 438/574 |
| 7,214,629 B1 * | 5/2007 | Luo et al. ...................... 438/778 |

(Continued)

FOREIGN PATENT DOCUMENTS

| CN | 1971882 | 5/2007 |
| CN | 101207130 | 6/2008 |

(Continued)

OTHER PUBLICATIONS

International Search Report for PCT/CN2011/071309.

(Continued)

*Primary Examiner* — Caridad Everhart
(74) *Attorney, Agent, or Firm* — Troutman Sanders LLP

(57) ABSTRACT

The present application discloses a method for manufacturing a semiconductor structure, comprising the steps of: a) providing a p-type field effect transistor; b) forming a tensile-stressed layer on the p-type field effect transistor; c) removing a portion of the tensile-stressed layer, so that the remaining portion of the tensile-stressed layer generates compressive stress in the channel of the p-type field effect transistor; and d) performing annealing, so as to achieve the object of memorizing compressive stress in a channel of a transistor and improving the performance of the transistor. The method according to the present invention memorizes the compressive stress in the channel of the transistor by a stress memorization technique, increases mobility of holes, and improves overall performance of the semiconductor structure.

13 Claims, 4 Drawing Sheets

(56) References Cited

U.S. PATENT DOCUMENTS

| | | | |
|---|---|---|---|
| 8,101,480 B1* | 1/2012 | Kim et al. | 438/231 |
| 2004/0075148 A1* | 4/2004 | Kumagai et al. | 257/369 |
| 2004/0113217 A1* | 6/2004 | Chidambarrao et al. | 257/415 |
| 2005/0285137 A1* | 12/2005 | Satoh | 257/178 |
| 2006/0189053 A1* | 8/2006 | Wang et al. | 438/197 |
| 2007/0010073 A1* | 1/2007 | Chen et al. | 438/486 |
| 2007/0093030 A1* | 4/2007 | Buehrer et al. | 438/296 |
| 2007/0132032 A1* | 6/2007 | Teo et al. | 257/369 |
| 2008/0057665 A1* | 3/2008 | Lindsay | 438/400 |
| 2008/0191243 A1* | 8/2008 | Liu et al. | 257/190 |
| 2009/0032881 A1* | 2/2009 | Lee et al. | 257/369 |
| 2009/0057769 A1* | 3/2009 | Wei et al. | 257/369 |
| 2009/0085122 A1* | 4/2009 | Ho et al. | 257/369 |
| 2009/0087974 A1* | 4/2009 | Waite et al. | 438/592 |
| 2009/0230439 A1* | 9/2009 | Wang et al. | 257/288 |
| 2010/0133621 A1* | 6/2010 | Frohberg et al. | 257/368 |
| 2010/0187636 A1* | 7/2010 | Yang et al. | 257/369 |
| 2010/0210081 A1* | 8/2010 | Garg et al. | 438/199 |
| 2010/0210084 A1* | 8/2010 | Yang et al. | 438/285 |
| 2011/0115028 A1* | 5/2011 | Datta et al. | 257/369 |
| 2011/0133259 A1* | 6/2011 | Fischer et al. | 257/288 |
| 2012/0228679 A1* | 9/2012 | Chang et al. | 257/288 |

FOREIGN PATENT DOCUMENTS

| | | |
|---|---|---|
| CN | 101217145 | 7/2008 |
| CN | 101226900 A | 7/2008 |
| CN | 101840862 A | 9/2010 |

OTHER PUBLICATIONS

Written Opinion for PCT/CN2011/071309.

Office Action from State Intellectual Property Office of the People's Republic of China, which was issued on Feb. 5, 2013.

Office Action from the State Intellectual Property Office of the People's Republic of China for CN201010501712.3 issued on Aug. 19, 2013.

English Translation of Office Action from the State Intellectual Property Office of the People's Republic of China for CN201010501712.3 issued on Aug. 19, 2013.

* cited by examiner

METHOD FOR MANUFACTURING SEMICONDUCTOR STRUCTURE

CROSS-REFERENCE TO RELATED APPLICATIONS

This application is a Section 371 National Stage Application of International Application No. PCT/CN2011/071309, filed on Feb. 25, 2011, which claims priority to CN 201010501712.3, filed on Sep. 30, 2010, the entire contents of which are incorporated herein by reference in their entirety.

BACKGROUND OF THE INVENTION

1. Field of Invention

The present invention generally relates to a method for manufacturing a semiconductor structure, and more particularly, to a method for manufacturing a high-performance semiconductor structure by a stress memory technique.

2. Description of Related Art

It is well known that performance of a field effect transistor (FET) may be improved when stress is applied thereto. In such a case that stress is applied to a field effect transistor, tensile stress may increase mobility of electrons, and thus driving current of an nFET, while compressive stress may increase mobility of holes, and thus driving current of a pFET.

One approach for providing such stress is referred to as Stress Memorization Technique (SMT), which comprises forming a material having intrinsic stress, such as silicon nitride, at various locations of a semiconductor structure, for example, above a channel region; performing annealing so that the stress is memorized at the respective locations, such as a gate region or an extension region; and removing the material having the stress. Thus, the stress remains and increases mobility of electrons or holes, which in turn enhances overall performance of the semiconductor structure.

One of the problems with the SMT is that it may only be applied to nFETs. In particular, annealing should be performed so as to memorize the stress in the semiconductor structure, typically at a high temperature. However, those materials used for applying the stress to the field effect transistor, such as nitride, may only provide tensile stress at the high temperature. Consequently, the application of SMT may be limited to nFETs.

In view of the above problem, there is a need for SMT which may be used in pFETs.

SUMMARY OF THE INVENTION

It is an object of the present invention to provide SMT for a pFET, which may be used to apply compressive stress to a channel of the pFET with conventional stress-inducing materials, and which may memorize the compressive stress from the stress-inducing layer above the pFET into the channel, increase mobility of holes, and improve overall performance of the semiconductor structure. Moreover, the method according to the present invention is easily implemented and has better industrial application.

The present invention provides a method for manufacturing a semiconductor structure, comprising:

a) providing a p-type field effect transistor;
b) forming a tensile-stressed layer on the p-type field effect transistor;
c) removing a portion of the tensile-stressed layer, so that the remaining portion of the tensile-stressed layer generates compressive stress in the channel of the p-type field effect transistor; and
d) performing annealing.

Preferably, the tensile-stressed layer comprises at least one selected from the group consisting of Si3N4, SiO2, SiOF, SiCOH, SiCO, SiCON, SiON, PSG and BPSG.

Preferably, in step b), the tensile-stressed layer is formed by a deposition process.

Preferably, in step b), the portion of the tensile-stressed layer is removed by selective etching Preferably, between the step a) and the step b), an etching stop layer is formed by a deposition process. More preferably, the material of the etching stop layer is different for that of the tensile-inducing layer. More preferably, the etching stop layer comprises SiO2.

Preferably, the step c) comprises forming a photoresist layer having a predetermined pattern by lithography; and etching the tensile-stressed layer with the photoresist layer having the predetermined pattern as a mask. More preferably, after the step c), the distance in the direction of the gate length between the edge of the remaining portion of the tensile-stressed layer and the external side of the gate is in the range of 0.02-0.2 µm.

Preferably, the p-type field effect transistor comprises a dummy gate having a dummy gate conductor and a gate dielectric. More preferably, after the step d), the method further comprises a step e) of: removing the dummy gate conductor to form an opening; and forming a gate in the opening. More preferably, in step e), the dummy gate conductor is removed by an etching process so as to expose the gate dielectric below the dummy gate conductor. Alternatively, in step e), the dummy gate conductor and the gate dielectric are removed by an etching process so as to expose a substrate below the gate dielectric.

In the method for manufacturing a semiconductor structure according to the present invention, the compressive stress may be memorized in a channel of a transistor by combining a lithography process, an etching process and a stress memorization technique, so as to increase mobility of holes and improve overall performance of the semiconductor structure. Moreover, the method according to the present invention is easily implemented and has better industrial application.

These and other features, aspects and advantages of the present invention will be apparent by reading the following description and claims.

DETAILED DESCRIPTION OF PREFERRED EMBODIMENTS

The present invention will be described below with preferred embodiments in connection with attached drawings. However, it should be understood that the descriptions here are only illustrative and are not intended to limit the protection scope. Also, the following description omits details of known structures and techniques so that concepts of the invention are not obscured unnecessarily.

Top views, cross-sectional views and perspective views of various structures of the semiconductor structure according to the embodiments of the present invention are shown in attached drawings. However, these figures are not drawn to scale, and some details may be exaggerated and other details may be omitted for simplicity. Shapes, relative sizes and positions of various regions/layers shown in the figures are only illustrative. Variations may exist due to manufacturing tolerance and technical limitations. Moreover, those skilled in the art may design regions/layers having different shapes, relative sizes and positions as required.

According to one embodiment of the present invention, there provides a method for manufacturing a high-performance semiconductor structure with a stress memorization technique, which may memorize compressive stress in the channel of a transistor, and in turn increase mobility of holes and improve overall performance of the semiconductor structure.

Figure 1:
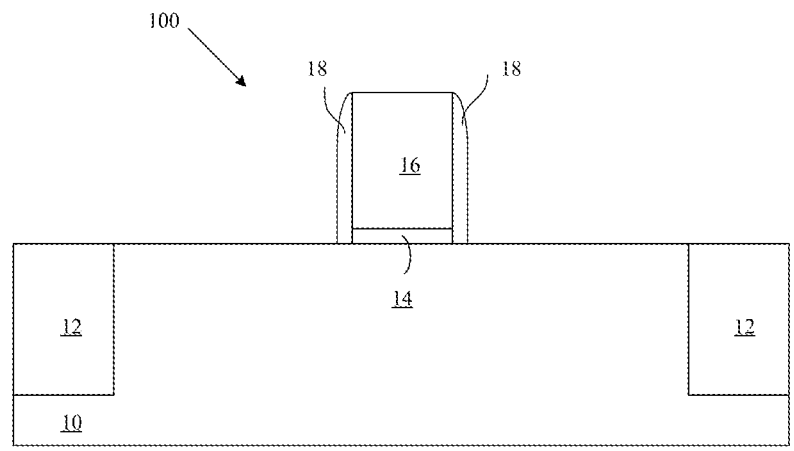
FIG. 1 shows an initial structure according to one embodiment of the present method.

FIG. 1 shows an initial structure according to one embodiment of the present method.

The initial structure is a p-type field effect transistor (pFET) 100. In the pFET 100 shown in FIG. 1, a substrate 10 is subjected to initial processing steps, such as formation of conventional shallow trench isolations (STIs) 12, well implantation, formation of a gate dielectric layer 14, formation of a gate conductor 16, and formation of a first sidewall spacer 18.

FIGS. 2-7 show the semiconductor structure at intermediate stages of the process flow according to one embodiment of the present method.

Figure 2:
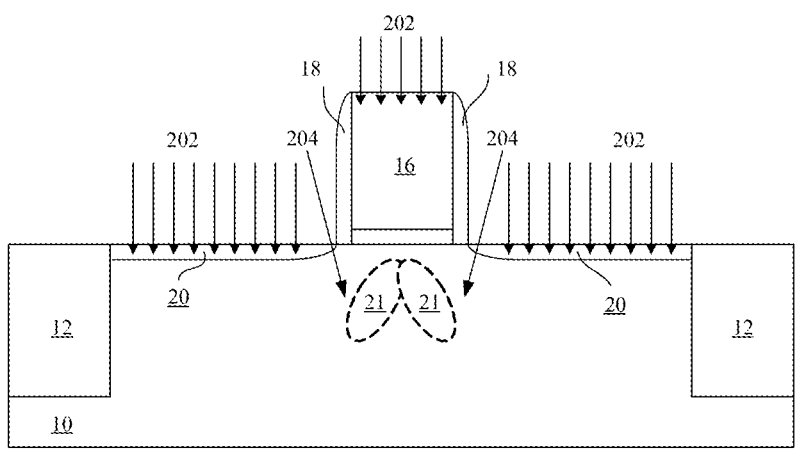
FIGS. 2-7 show the semiconductor structure at intermediate stages of the process flow according to one embodiment of the present method.

According to one embodiment of the present method, an extension implantation is preferably performed to the initial structure of the pFET 100, as shown in FIG. 2. Optionally, a halo implantation may be further performed.

The gate conductor 16 and the first sidewall spacer 18 are used as a mask, and the extension implantation may be performed in a direction indicated by arrow 202 to form extension regions 20 in the exposed portions of the substrate 10 at both sides of the gate conductor 16 and the first sidewall spacer 18. For the pFET in the illustrated embodiment of the present invention, p-type dopants such as boron (B or BF2) and indium (In) or any combination thereof may be used in the extension implantation. The extension region 20 has the effect of reducing the peak value of the electric field, and thus suppresses short channel effects.

Optionally, the gate conductor 16 and the first sidewall spacer 18 may be used as a mask again, and halo implatation may be performed in a direction indicated by arrow 204 at a predetermined tilt angle to form halo regions 21 at the portion of the substrate 10 below the gate dielectric 14. For the pFET in the illustrated embodiment of the present invention, n-type dopants such as arsenic (As), phosphor (P) or their combination may be used in the halo implantation. Here, the halo regions 21 may be used mainly for blocking diffusion into the channel region during the subsequent step of forming source/drain regions 24 (as will be shown in FIG. 3), which in turn suppresses the short channel effect.

Figure 3:
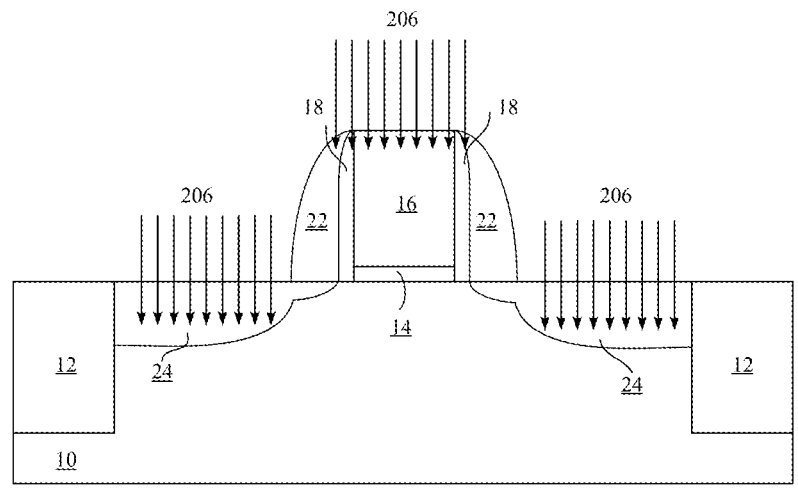

Referring to FIG. 3, a second sidewall spacer 22 is formed at both sides of the gate conductor 16 and the first sidewall spacer 18, and source/drain regions are also formed.

The second sidewall spacer 22 may be formed, for example, by forming a material of the second sidewall spacer on the whole surface of the semiconductor structure by a conventional deposition process such as Physical Vapor Deposition (PVD), Chemical Vapor Deposition (CVD), Atomic Layer Deposition (ALD), sputtering, and the like, and performing anisotropic etching, preferably Reactive Ion Etching (RIE), to formed the second sidewall spacer 22, as shown in FIG. 3. The material of the second sidewall spacer 22 may be the same as or different from that of the first sidewall spacer. Preferably, the second sidewall spacer 22 comprises Si3N4. In the subsequent step, the second sidewall spacer 22 will be used as a mask and/or an etching stop layer.

The gate conductor 16 and the second sidewall spacer 22 are used as a mask and ions are implanted in a direction indicated by arrow 206 to provide source/drain regions 24 in the exposed portions of the substrate 10 at both sides of the gate region consisting of the gate conductor 16 and the second sidewall spacer 22. For the pFET in the illustrated embodiment of the present invention, p-type dopants such as boron (B or BF2) and indium (In) or any combination thereof may be used in the source/drain implantation. Typically, the source/drain regions 24 and the extension region 20 have dopants of the same type of conductivity, but of the same or different species and doping concentrations.

Figure 4:
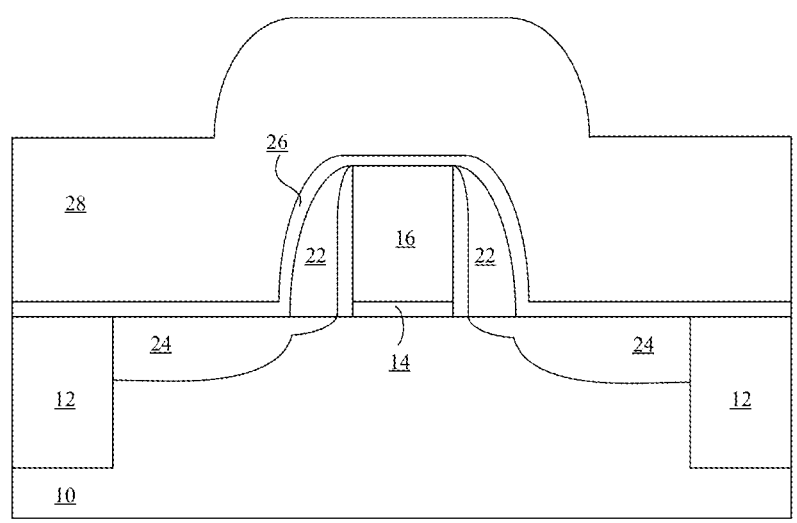

Referring to FIG. 4, an etching stop layer 26 and a tensile-stressed layer 28 are formed in sequence on the semiconductor structure shown in FIG. 3. Here, the respective layers may be formed, for example, by the above-mentioned deposition processes. Here, the etching stop layer 26 is made of a material different from that of the tensile-stressed layer 28. Typically, the etching stop layer 26 comprises SiO2, and the tensile-stressed layer 28 is made of at least one selected from a group consisting of Si3N4, SiO2, SiOF, SiCOH, SiCO, SiCON, SiON, PSG and BPSG. Alternatively, the etching stop layer 26 may also be formed by a thermal oxidation process.

Figure 5:
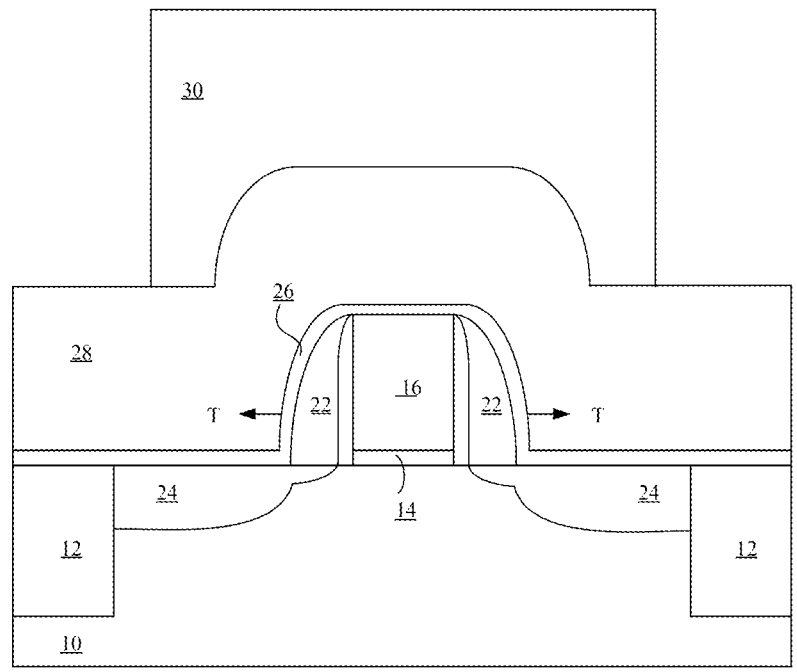
Figure 6:
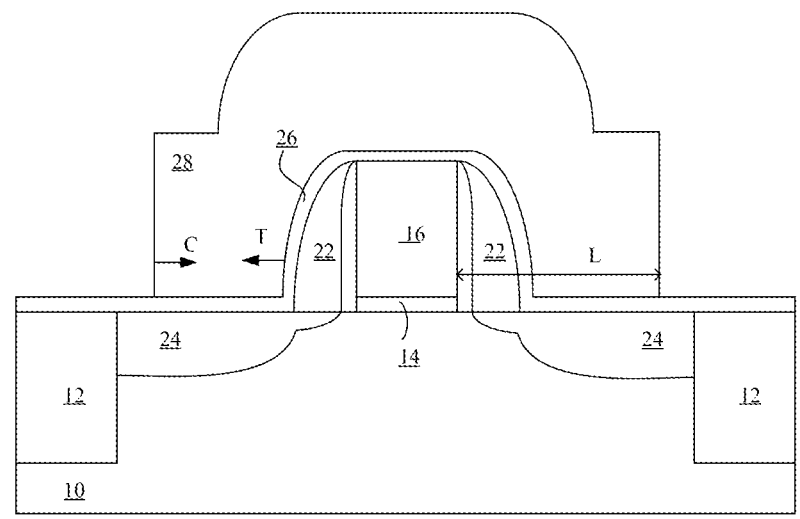

Referring to FIGS. 5-6, the tensile-stressed layer 28 is selectively etched.

Referring to FIG. 5, lithography is performed to provide a photoresist layer having a predetermined pattern. For example, the photoresist layer 30 is applied on the semiconductor structure shown in FIG. 4 (for example, by spin-coating) so that the photoresist layer 30 covers the whole surface of the semiconductor structure. Then the photoresist layer 30 is patterned. Typically, the photoresist layer 30 is patterned by steps comprising exposure, development and baking for hardening the photoresist, so as to provide the photoresist layer having the predetermined pattern.

Referring to FIG. 6, a portion of the tensile-stressed layer 28 is removed with the patterned photoresist layer as a mask, for example, by selective etching such as RIE, stopping at the etching stop layer 26, and removing the photoresist layer, so that the remaining portion of the tensile-stressed layer generates compressive stress in the channel. Here, the compressive stress concentrates on the channel region after the etching process. Specifically, the tensile-stressed layer 28 generates tensile stress (T) applied to the channel in a direction indicated by the arrow in the semiconductor structure shown in FIG. 5. In the semiconductor structure shown in FIG. 6 after the etching process, the tensile-stressed layer generates compressive stress (C) in a direction indicated by the arrow. Thus, a resultant force of the intrinsic tensile stress (T) and the generated compressive stress (C) is applied to the channel. As will be known by one skilled person in the field, compressive stress is applied to the channel when the generated compressive stress (C) is larger than the intrinsic compressive stress (T). If too small a portion of the stress layer is etched away, the stress applied to the channel may be the undesired tensile stress. However, if the stress layer is excessively etched away, it may be difficult for the remaining portion of the stress layer to generate sufficiently large compressive stress.

In order to ensure compressive stress to be applied to the channel by the etched tensile-stressed layer 28, the distance L between the edge of the remaining portion of the tensile-stressed layer and the external side of the gate may be preferably in the range of 0.02-0.2 μm.

Figure 7:
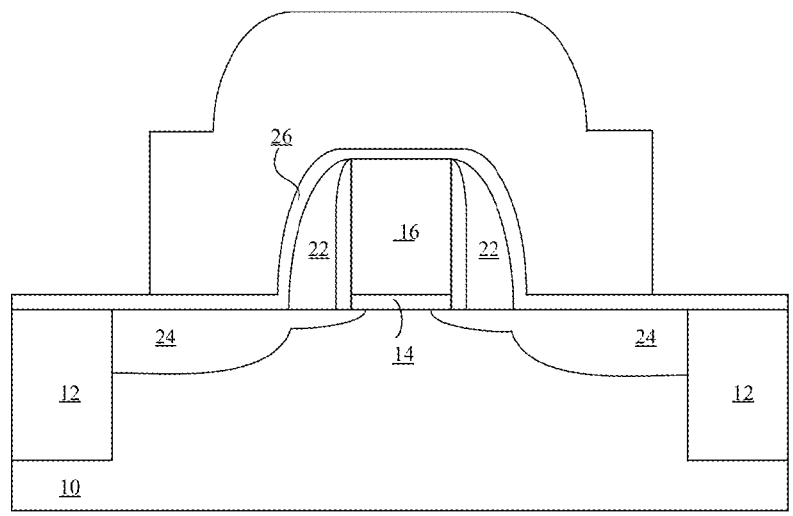

Referring to FIG. 7, annealing is performed so that the stress from the tensile-stressed layer 28 is memorized in the semiconductor structure, and the dopants in the extension regions 20 and source/drain regions 24 (and halo regions 21 if exist) are activated, and the defects on the surface and in the semiconductor material are removed. In one embodiment of the present invention, rapid thermal annealing (RTA) is performed, for example, at about 1000° C. for about 0-1 second.

In the method for manufacturing a semiconductor structure according to the present invention, the compressive stress is memorized in the channel by depositing and etching a tensile-stressed layer and then performing annealing, which achieves an excellent stress memorization effect.

As shown in FIG. 7, the extension regions 20 diffuse towards the channel region below the gate dielectric 14 after annealing.

Figure 8:
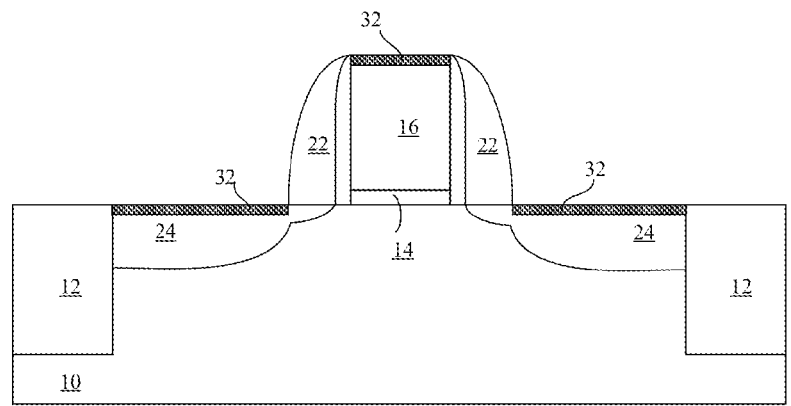
FIG. 8 shows a semiconductor structure manufactured according to one embodiment of the present method.

Referring to FIG. 8, the tensile-stressed layer 28 and the etching stop layer 28 are removed, for example, by wet etching or reactive ion etching (RIE), and a conventional silicidation process is performed to the semiconductor structure.

Optionally, a replacement gate process may be performed after removal of the tensile-stressed layer 28 and the etching stop layer 26. Specifically, the dummy gate conductor 16 may be removed by etching so as to expose the gate dielectric 14 after removal of the tensile-stressed layer 28 and the etching stop layer 26. Furthermore, a new gate conductor may be formed by the replacement gate process (not shown). For example, a new gate conductor layer may be formed on the whole surface of the semiconductor structure by a deposition process, followed by etching such as RIE so as to remove the portions of the new gate conductor material that cover the surfaces of the substrate and the sidewall spacer.

Optionally, the gate dielectric 14 may also be removed by further etching after removal of the dummy gate conductor 16 so as to expose the substrate beneath the gate dielectric 14. Furthermore, a new gate dielectric and a new gate conductor may be formed by the replacement process. For example, a new gate dielectric and a new gate conductor layer may be formed on the whole surface of the semiconductor structure by a deposition process, followed by etching such as RIE so as to remove the portions of the new gate dielectric and the new gate conductor material that cover the surfaces of the substrate and the sidewall spacer.

Here, the material of the new gate dielectric comprises high-K materials. Examples of the high K material include, but not limited to, hafnium-based materials such as HfO2, HfSiO, HfSiON, HfTaO, HfTiO or HfZrO, zirconia, lanthana, titania, barium strontium titanate (BST), or lead zirconate titanate (PZT).

The new gate conductor material comprises, but not limited to, metals, metal alloys, metal nitrides, metal silicides, any stack or combination thereof. Here, the gate conductor layer 36 preferably comprises a stack of a work function metal layer and a gate metal layer. Examples of the work function metal layer include, but not exclusively, TiN, TiAlN, TaN, TaAlN, or their combinations.

As shown in FIG. 8, a conventional silicidation process is performed to the semiconductor structure. A metal layer (not shown) is formed on the semiconductor layer by a deposition process so that it covers the whole semiconductor device. The metal layer preferably comprises NiPt. Annealing is performed at about 250° C.-500° C. so that the deposited metal reacts with the underlying silicon to provide a silicide layer 32. Here, the silicide layer 32 preferably comprises NiPtSi.

In the illustrated embodiment of the present invention, silicides are provided at the surface of the source/drain regions 24 and the gate conductor 16, which is suitable for a gate-first process. However, in the replacement gate process, silicides may be provided or not provided at the surface of the gate conductor. In the interconnect structure to be formed, the silicide layer 32 may reduce ohmic contact of the plugs in the contact holes with the source/drain regions 24 and the gate conductor 16. The unreacted metals are selectively removed by wet etching in which a solution of sulfuric acid is, for example, used.

In the method for manufacturing a semiconductor structure according to the present invention, the compressive stress may be memorized in the channel of a transistor by combining an etching process by lithography process and a stress memorization technique, so as to increase mobility of holes and improve overall performance of the semiconductor structure. Moreover, the method according to the present invention is easily implemented and has better industrial application.

While the present invention has been described in the above embodiment with reference to the semiconductor structure shown in FIG. 8, one skilled person will appreciate that various conventional variations may be made in the semiconductor structure according to the present invention. The applicant intends to encompass any of the existed structures and those developed in the future but having the same function.

In the above description, no details are given for those conventional operations. Nevertheless, one skilled person will understand that the layers and regions having desired shapes may be formed by various approaches well known in the field. Moreover, one skilled person may propose a process completely different from the above processes for providing the same structure.

While the invention has been described with reference to specific embodiments, the description is only illustrative of the invention. The description is not construed as limiting the invention. The protection scope is defined by the attached claims and their equivalents. One skilled person will readily recognize that various modifications and changes may be made to the present invention without departing from the true scope of the present invention.

The invention claimed is:

1. A method for manufacturing a semiconductor structure, comprising:
   a) providing a p-type field effect transistor comprising source and drain regions;
   b) forming a tensile-stressed layer on the p-type field effect transistor;
   c) removing a portion of the tensile-stressed layer so that the remaining portion of the tensile-stressed layer has edges between the p-type field effect transistor and shallow trench isolations, and generating compressive stress in the channel of the p-type field effect transistor by the remaining portion of the tensile-stressed layer on the p-type field effect transistor;
   d) performing annealing to memorize the compressive stress in the channel of the p-type field effect transistor; and
   e) removing the remaining portion of the tensile-stressed layer after the annealing.

2. The method according to claim 1, wherein the tensile-stressed layer comprises at least one selected from a group including Si3N4, SiO2, SiOF, SiCOH, SiCO, SiCON, SiON, PSG and BPSG.

3. The method according to claim 1, wherein in step b), the tensile-stressed layer is formed by a deposition process.

4. The method according to claim 1, wherein in step c), the portion of the tensile-stressed layer is removed by selective etching.

5. The method according to claim 1, wherein after step a) and before step b), an etching stop layer is formed by a deposition process.

6. The method according to claim 5, wherein the etching stop layer is made of a material different from that of the tensile-stressed layer.

7. The method according to claim 6, wherein the etching stop layer comprises SiO2.

8. The method according to claim 4, wherein the step c) comprises: forming a photoresist layer having a predetermined pattern by lithography; and etching the tensile-stressed layer with the patterned photoresist layer as a mask.

9. The method according to claim 8, wherein after step c), the distance in the direction of the gate length between the edge of the remaining portion of the tensile-stressed layer and the external side of the gate is in the range of 0.02-0.2 µm.

10. The method according to claim 1, wherein the p-type field effect transistor comprises a dummy gate having a dummy gate conductor and a gate dielectric.

11. The method according to claim 10, wherein after step d), the method further comprises a step e) of:
    removing the dummy gate conductor to provide an opening, and forming a gate in the opening.

12. The method according to claim 11, wherein in step e), the dummy gate conductor is removed by an etching process so as to expose the gate dielectric below the dummy gate conductor.

13. The method according to claim 11, wherein in step e), the dummy gate conductor and the gate dielectric are removed by an etching process so as to expose a substrate beneath the gate dielectric.

* * * * *